United States Patent
An et al.

(10) Patent No.: US 8,625,325 B2
(45) Date of Patent: Jan. 7, 2014

(54) MEMORY CELLS INCLUDING RESISTANCE VARIABLE MATERIAL PATTERNS OF DIFFERENT COMPOSITIONS

(75) Inventors: Hyeong-Geun An, Hwaseong-si (KR); Ik-Soo Kim, Yongin-si (KR); Hee-Ju Shin, Yongin-si (KR); Dong-Hyun Im, Hwaseong-si (KR); Sung-Lae Cho, Gwacheon-si (KR); Eun-Hee Cho, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 423 days.

(21) Appl. No.: 12/853,329

(22) Filed: Aug. 10, 2010

(65) Prior Publication Data

US 2011/0032753 A1    Feb. 10, 2011

(30) Foreign Application Priority Data

Aug. 10, 2009    (KR) .................. 10-2009-0073390

(51) Int. Cl.
    *G11C 11/56*    (2006.01)
(52) U.S. Cl.
    USPC .......................................... 365/148; 365/163
(58) Field of Classification Search
    USPC ................. 365/163, 148; 257/2–5, E47.001, 257/E29.002
    See application file for complete search history.

(56) References Cited

U.S. PATENT DOCUMENTS

| | | | |
|---|---|---|---|
| 7,897,953 B2* | 3/2011 | Liu | 257/2 |
| 7,939,813 B2* | 5/2011 | Jang | 250/492.22 |
| 2005/0051901 A1* | 3/2005 | Chen | 257/758 |
| 2005/0074933 A1* | 4/2005 | Lowrey | 438/200 |
| 2006/0226411 A1* | 10/2006 | Lee | 257/2 |
| 2007/0097739 A1* | 5/2007 | Happ et al. | 365/163 |
| 2007/0108431 A1* | 5/2007 | Chen et al. | 257/4 |
| 2008/0019170 A1* | 1/2008 | Happ et al. | 365/163 |
| 2008/0068879 A1* | 3/2008 | Ahn et al. | 365/163 |
| 2008/0173860 A1 | 7/2008 | Shin et al. | |
| 2008/0205128 A1 | 8/2008 | Nakai | |
| 2008/0248632 A1 | 10/2008 | Youn et al. | |
| 2009/0045386 A1* | 2/2009 | Chen | 257/3 |

* cited by examiner

*Primary Examiner* — Douglas King
(74) *Attorney, Agent, or Firm* — Volentine & Whitt, PLLC

(57) ABSTRACT

A non-volatile memory device includes a plurality of word lines, a plurality of bit lines, and an array of variable resistance memory cells each electrically connected between a respective word line and a respective bit line. Each of the memory cells includes first and second resistance variable patterns electrically connected in series between first and second electrodes. A material composition of the first resistance variable pattern is different than a material composition of the second resistance variable pattern. Multi-bit data states of each memory cell are defined by a contiguous increase in size of a programmable high-resistance volume within the first and second resistance variable patterns.

20 Claims, 18 Drawing Sheets

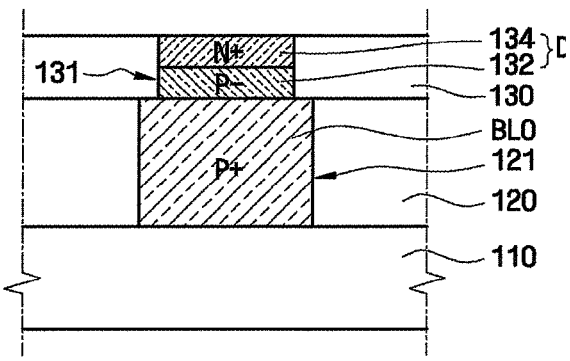
FIG. 9
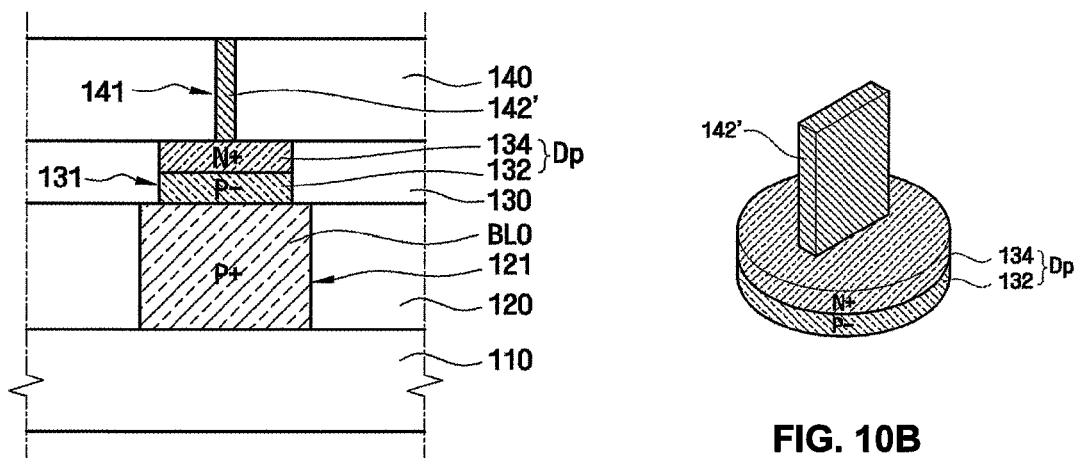
FIG. 10A  FIG. 10B

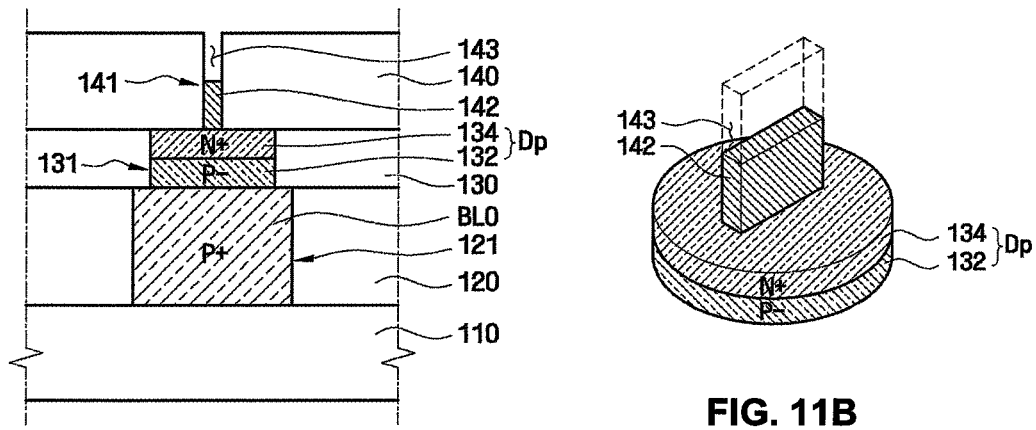
FIG. 11A
FIG. 11B
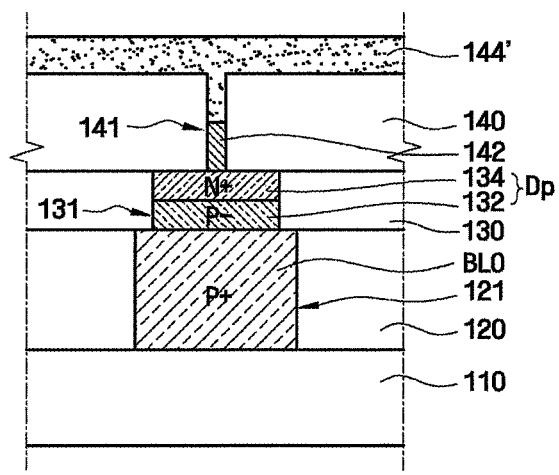
FIG. 12

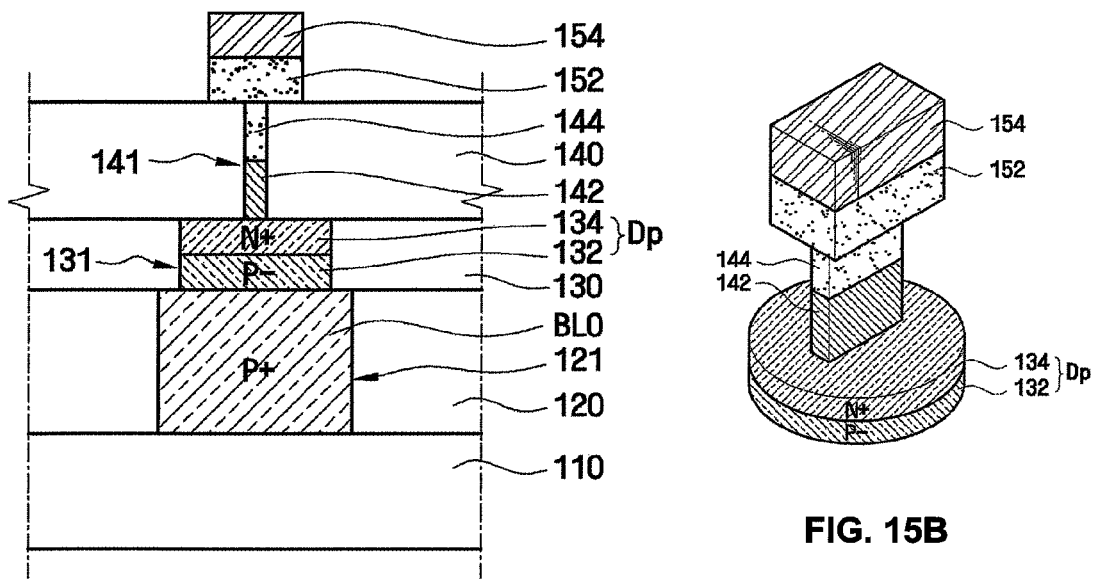
FIG. 15A  FIG. 15B
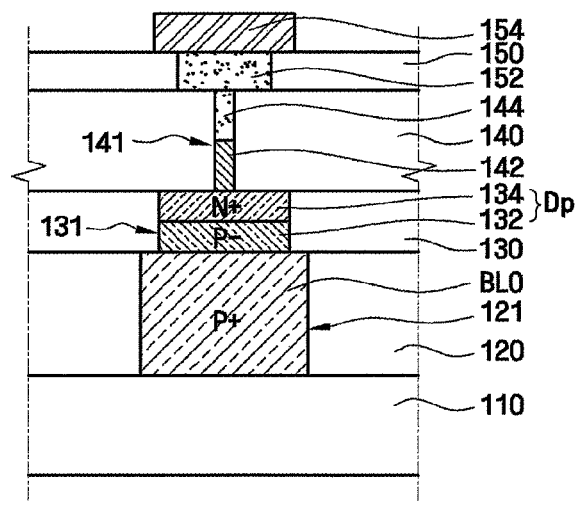
FIG. 16

MEMORY CELLS INCLUDING RESISTANCE VARIABLE MATERIAL PATTERNS OF DIFFERENT COMPOSITIONS

CROSS-REFERENCE TO RELATED APPLICATION(S)

A claim of priority is made to Korean patent application no. KR 10-2009-0073390, filed Aug. 10, 2009, in the Korean Intellectual Property Office, the disclosure of which is incorporated herein in its entirety.

BACKGROUND

The inventive concepts described herein generally relate to memory devices. In particular, the inventive concepts relative to memory devices which include programmable volumes of resistance variable material such as, for example, so-call phase-change memory devices.

Certain types of non-volatile memory devices rely on programmable resistive characteristics of memory cells to store data. These types of memory devices are generally referred to herein as resistance variable memory cell devices, and example of which is the phase-change memory cell device.

A phase-change random access memory (PRAM), also known as an Ovonic Unified Memory (OUM), includes a phase-change material such as a chalcogenide alloy which is responsive to energy (e.g., thermal energy) so as to be stably transformed between crystalline and amorphous states. Such a PRAM is disclosed, for example, in U.S. Pat. Nos. 6,487,113 and 6,480,438.

The phase-change material of the PRAM exhibits a relatively low resistance in its crystalline state, and a relatively high resistance in its amorphous state. In conventional nomenclature, the low-resistance crystalline state is referred to as a 'set' state and is designated logic "0", while the high-resistance amorphous state is referred to as a 'reset' state and is designated logic "1".

The terms "crystalline" and "amorphous" are relative terms in the context of phase-change materials. That is, when a phase-change memory cell is said to be in its crystalline state, one skilled in the art will understand that the phase-change material of the cell has a more well-ordered crystalline structure when compared to its amorphous state. A phase-change memory cell in its crystalline state need not be fully crystalline, and a phase-change memory cell in its amorphous state need not be fully amorphous.

Generally, the phase-change material of a PRAM is reset to an amorphous state by joule heating of the material in excess of its melting point temperature for a relatively short period of time. On the other hand, the phase-change material is set to a crystalline state by heating the material below its melting point temperature for a longer period of time. In each case, the material is allowed to cool to its original temperature after the heat treatment. Generally, however, the cooling occurs much more rapidly when the phase-change material is reset to its amorphous state.

The speed and stability of the phase-change characteristics of the phase-change material are critical to the performance characteristics of the PRAM. As suggested above, chalcogenide alloys have been found to have suitable phase-change characteristics, and in particular, a compound including germanium (Ge), antimony (Sb) and tellurium (Te) (e.g., $Ge_2Sb_2Te_5$ or GST) exhibits a stable and high speed transformation between amorphous and crystalline states.

SUMMARY

According to an aspect of the inventive concepts described herein, a multi-bit memory cell programmable into at least four data states is provided. The memory cell includes a first resistance variable material pattern formed of a first resistance variable material that is programmable between first and second resistive states, and a second resistance variable material pattern formed of a second resistance variable material that is programmable between the first and second resistive states. The second resistance variable material is different than the first resistance variable material, and a resistance of the first resistance variable material in the second resistive state is less than a resistance of the second variable resistance material in the second resistive state. In a first data state, both the first resistance variable material pattern and the second resistance variable material pattern are in the first resistive state. In a second data state, at least a portion of the first resistance variable material pattern is in the second resistive state and the second resistance variable material pattern is in the first resistive state. In a third data state, the first resistance variable material pattern is in the first second resistive state and a first portion of the second resistance variable material pattern is the second resistive state, where the first portion of the second resistance variable material pattern is contiguous with the first resistance variable material pattern. In fourth data state, the first resistance variable material pattern is in the second resistive state and a second portion of the second resistance variable material pattern is second resistive state, where the second portion of the second variable resistance material pattern is larger than the first portion and is contiguous with the first resistance variable material pattern.

According to another aspect of the invention concepts described herein, a non-volatile memory device is provided which includes a plurality of word lines, a plurality of bit lines, and an array of variable resistance memory cells each electrically connected between a respective word line and a respective bit line. Each of the memory cells includes first and second resistance variable patterns electrically connected in series between first and second electrodes. A material composition of the first resistance variable pattern is different than a material composition of the second resistance variable pattern. Multi-bit data states of each memory cell are defined by a contiguous increase in size of a programmable high-resistance volume within the first and second resistance variable patterns.

According to yet another aspect of the inventive concepts described herein, a method of programming a multi-bit resistance variable memory cell is provided. The memory cell includes first and second resistance variable patterns of different material compositions, and the method includes supplying respective programming currents to the memory cell such that multi-bit data states of each memory cell are defined by a contiguous increase in size of a programmable high-resistance volume within the first and second resistance variable patterns.

BRIEF DESCRIPTION OF THE DRAWINGS

The above and other aspects of inventive concepts described herein will become readily apparent from the detailed description that follows, with reference to the accompanying drawings, in which:

FIGS. 6~9, 10A, 10B, 11A, 11B, 12, 13A, 13B, 14A, 14B, 15A and 15B are cross-sectional and perspective views for describing a method of fabricating a phase-change memory cell device according to one or more inventive aspects described herein;

FIG. 16 is a perspective view of another phase-change memory cell according to an embodiment of one or more inventive aspects described herein

DETAILED DESCRIPTION OF EMBODIMENTS

Figure 1:
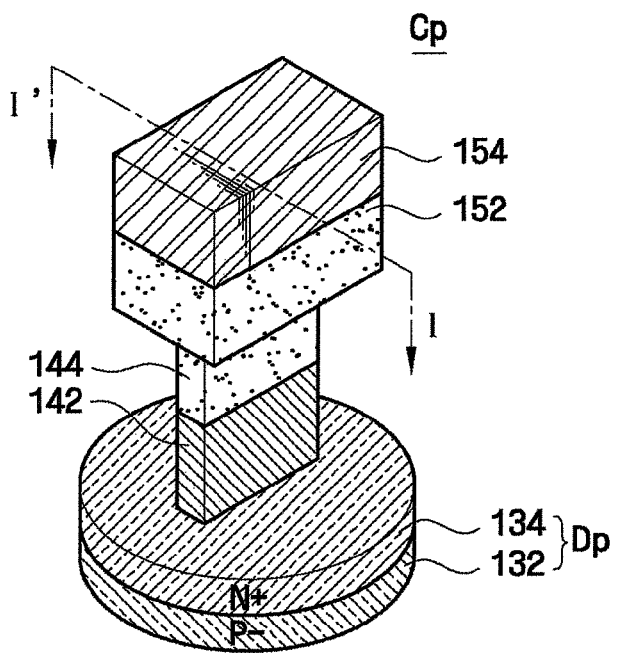
FIG. 1 is a perspective view of a phase-change memory cell according to an embodiment of one or more inventive aspects described herein.

Various example embodiments are described with reference to the accompanying drawings, where like reference numbers are used to denote like or similar elements. The inventive concepts may, however, be embodied in many different forms and should not be construed as limited to the embodiments set forth herein.

In the drawings, the relative dimensions of device layers may be exaggerated for clarity. That is, for example, the relative thicknesses and/or widths of layers may be varied from those depicted. For example, unless the description clearly indicates otherwise, if a first layer is shown as being thicker than a second layer, the two layers may instead have the same thickness or the second layer may be thicker than the first layer.

To facilitate understanding, a number of non-limiting descriptive terms may be utilized which are not intended to define the scope of the inventive concepts. For example, although the terms "first", "second", etc. may be used herein to describe various elements, these elements should not be limited by these terms. These terms are simply used to distinguish one element from another. For example, a first element could be termed a second element, and, similarly, a second element could be termed a first element, without departing from or limiting the scope of the inventive concepts. Likewise, the words "over", "under", "above", "below", etc. are relative terms which are not intended to limit the inventive concepts to a particular device orientation. As used herein, the term "and/or" includes any and all combinations of one or more of the associated listed items.

Further, the terminology utilized herein often makes reference to a "layer" of material. It will be understood that the inventive concepts are not limited to single-layer structures when reference is made to a layer of material. For example, an insulating layer can actually encompass multiple layers of insulating material which essentially achieve the same insulating functions as a single insulating layer of material. This same reasoning is to be applied to semiconductor and conductive regions as well.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
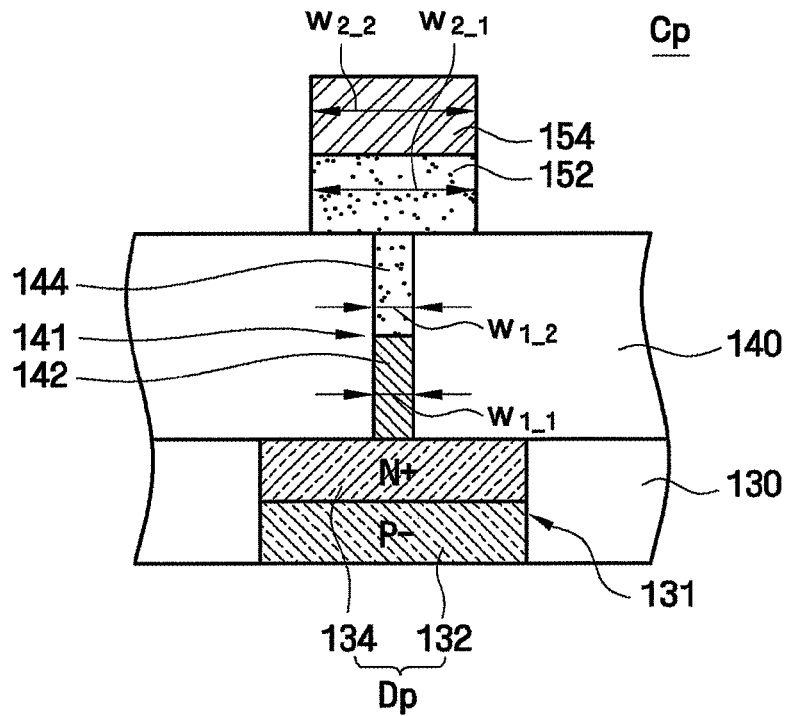
FIG. 2 is a cross-sectional view taken along line I-I' of FIG. 1.

Reference is now made to FIGS. 1 and 2 which schematically illustrate a non-volatile memory cell according an embodiment of one or more inventive aspects described herein. FIG. 2 corresponds to a cross-sectional view taken along line I-I' of the perspective view of FIG. 1.

Referring collectively to FIGS. 1 and 2, the non-volatile memory cell of this example includes an insulating layer (or mold layer) 130 having a diode element Dp formed in an aperture 131 of the insulating layer 130. The diode element Dp of this example includes a P-doped semiconductor layer 132 and an N+ doped semiconductor layer 131 stacked within the aperture 131.

An insulating layer (or mold layer) 140 is located over the insulating layer 130 in the example of FIGS. 1 and 2, and an aperture 141 is defined within the insulating layer 130 and aligned over the aperture 131 of the mold layer 130. A lower electrode 142 is contained within a lower portion of the aperture 141 in electrical contact with the N+ semiconductor layer 134 of the diode element Dp. Further, a first programmable volume 144 (also referred to herein as a first phase-change material pattern) is located in an upper portion of the aperture 141 in electrical contact with the lower electrode 142.

A second programmable volume 152 (also referred to herein as a second phase-change material pattern) is located over the insulating layer 140 so as to electrically contact the first programmable volume 144 within the aperture 141 of the insulating layer 140. Finally, an upper electrode 154 is located over and electrically contacts the second programmable volume 152.

In the example of this embodiment, the first and second programmable volumes 144 and 152 are respectively formed of different phase-change materials. Further, in the example of this embodiment, the phase-change material of the second programmable volume 152 has a higher resistance in an amorphous state then the phase-change material of the first programmable volume 144. A non-limiting example of the phase-change material of the first programmable volume 144 is SbTe. Non-limiting examples of the phase-change material of the second programmable volume 152 include GeSbTe, BeBiTe, C-doped BeSbTe and N-doped GeSbTe.

The example embodiment illustrated in FIGS. 1 and 2 is at least partially characterized by the first programmable volume 144 being spatially confined relative to the second programmable volume 152. This can be seen in FIG. 2 where the width W1_2 of the first programmable volume 144 is less than a width W2_1 of the second programmable volume 152. In this example, the "width" extends parallel to a bit line or word line (not shown). Preferably, the width W1_2 is 80% or less the width W2_1. More preferably, the width W1_2 is 50% or less the width W2_1. Even more preferably, width W1_2 is 30% or less the width W2_1.

As best shown in FIG. 1, the length (perpendicular to the width) of the first programmable volume 144 may also be less than the length of the second programmable volume 152. Further, as shown in FIG. 2, the width W1_1 of the lower electrode 142 is the same as that first programmable volume 144, and the width W2_2 is the same as that of the second programmable volume 152. However, the embodiment is not limited in this respect.

Spatial confinement of the first programmable volume 144 as described above is effective to increase the precision of programmable control of data states, such as during execution of the examples described below with reference to FIGS. 3A~3D.

As will be explained next with reference to FIGS. 3A~3D, the non-volatile memory cell Cp of FIGS. 1 and 2 is capable of storing at least two-bits of data.

FIGS. 3A~3D are schematic cross-sectional views of the first and second programmable volumes 144 and 152, where a darkly-shaded region denotes an amorphous state of the region, and a lightly-shaded region denotes a crystalline state of the region.

Figure 3A:
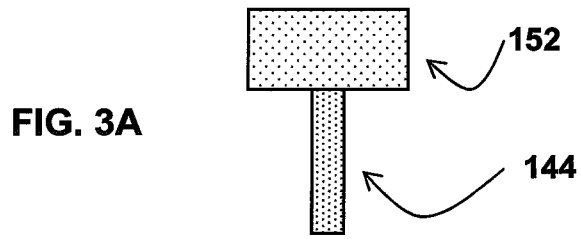
FIGS. 3A~3D are cross-sectional perspective views for describing programmable data states of the phase-change memory cell illustrated in FIG. 1.

Referring to FIG. 3A, this figure denotes a first state (e.g., a "00" state) in which both the first programmable volume 144 and the second programmable volume 152 are crystalline. In this state the memory cell Cp exhibits a relatively low cell resistance, e.g., between 1K and 100KΩ. A specific non-limiting example of the cell resistance in the "00" state is about 27KΩ.

Figure 3B:
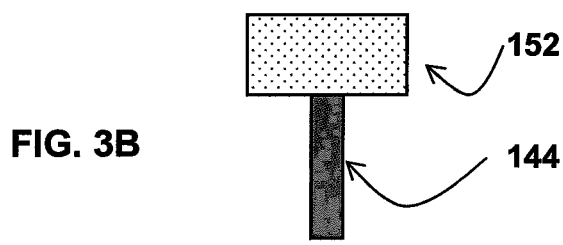

FIG. 3B denotes a second data state (e.g., a "01" state) in which the first programmable volume 144 is amorphous, and the second programmable volume 152 is crystalline. Here, the cell resistance is increased relative to that of the "00" state. For example, the cell resistance in the "01" state may, for example, be in the 10K to 1.0 MΩ range. A specific non-limiting example of the cell resistance in the "01" state is about 158KΩ.

Figure 3C:
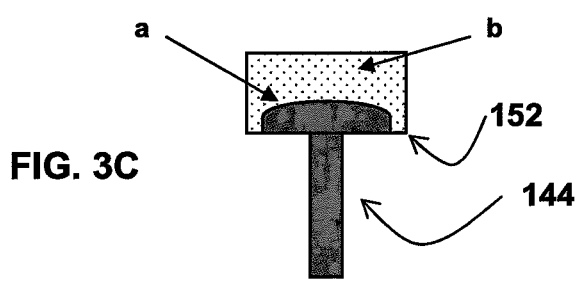

Turning to FIG. 3C, a third data state (e.g., a "10" state) is shown in which the first programmable volume 144 is amorphous, a region "a" of the second programmable volume 152 is amorphous, and a remaining region "b" of the second programmable volume 144 is crystalline. As shown, the amorphous region "a" of the second programmable volume 152 is contiguous with the amorphous first programmable volume 144. Here, the cell resistance is increased relative to that of the "01" state. For example, the cell resistance in the "10" state may, for example, be in the 100K to 2.0MΩ range. A specific non-limiting example of the cell resistance in the "00" state is about 1.0MΩ.

Figure 3D:
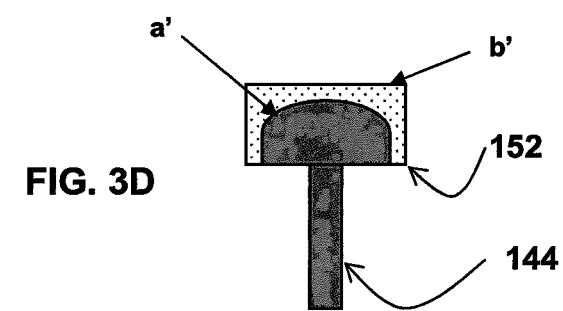

FIG. 3D denotes a fourth data state (e.g., a "11" state) in which the first programmable volume 144 is amorphous, a region "a" of the second programmable volume 152 is amorphous, and a remaining region "b" of the second programmable volume 144 is crystalline. As shown, the amorphous region "a" of the second programmable volume 152 is contiguous with the amorphous first programmable volume 144. Further, as shown, the amorphous region "a" of the second programmable volume 152 of FIG. 3D occupies a larger area than the amorphous "a" of FIG. 3C. Thus, the cell resistance is increased relative to that of the "10" state. For example, the cell resistance in the "11" state may, for example, be in the 1.0M to 5.0MΩ range. A specific non-limiting example of the cell resistance in the "11" state is about 2.8MΩ.

As can be seen with reference to FIGS. 3A~3D, the multi-bit data states of the memory cell are defined by a contiguous increase in size of the programmable high-resistance amorphous volume within the first and second programmable volumes 144 and 152.

Figure 4:
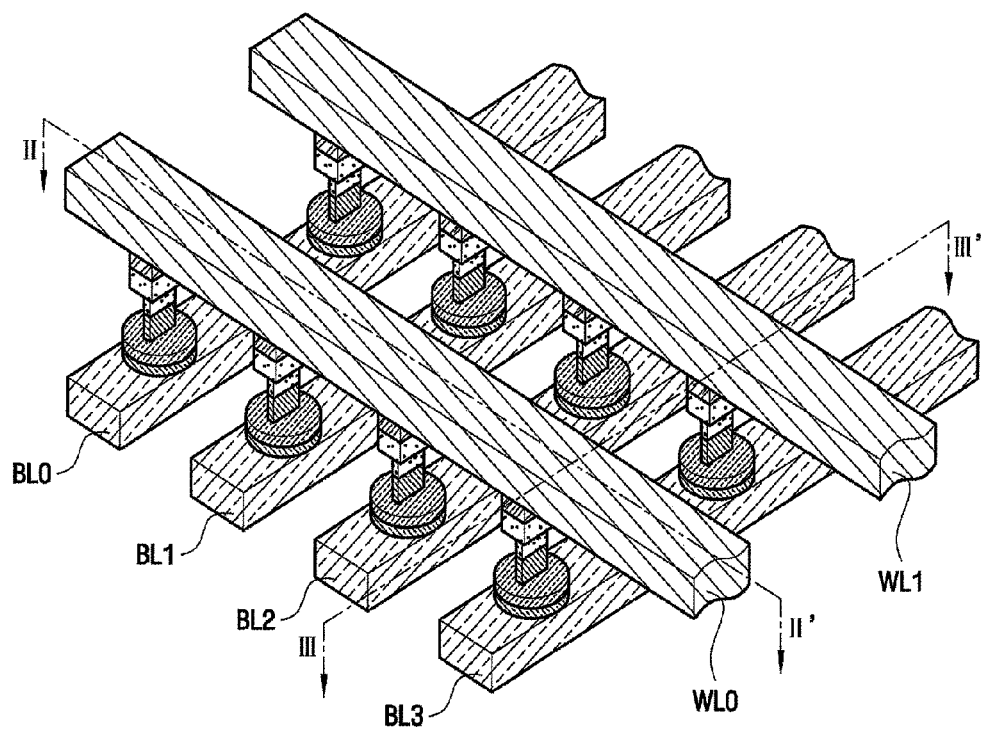
FIG. 4 is a perspective view of a phase-change memory cell array according to an embodiment of one or more inventive aspects described herein.

An example of a portion of a memory cell array according to one or more inventive concepts described herein will be described next with reference to the perspective view of FIG. 4 and the cross-sectional views of FIGS. 5A and 5B. In these drawings, FIG. 5A is a cross-sectional view taken line II-II' of FIG. 4, and FIG. 5B is a cross-sectional view taken along line III-III' of FIG. 4.

In this example, a memory cell array 1 includes a plurality of word lines WL0 and WL1 extending lengthwise in a direction which is substantially perpendicular to a plurality of bit lines BL0~BL3, to thereby define a plurality of intersection regions therebetween. Each intersection region includes a phase-change memory cell Cp such as that illustrated in FIGS. 1 and 2 connected between a corresponding word line WL and bit line BL.

Figure 5A:
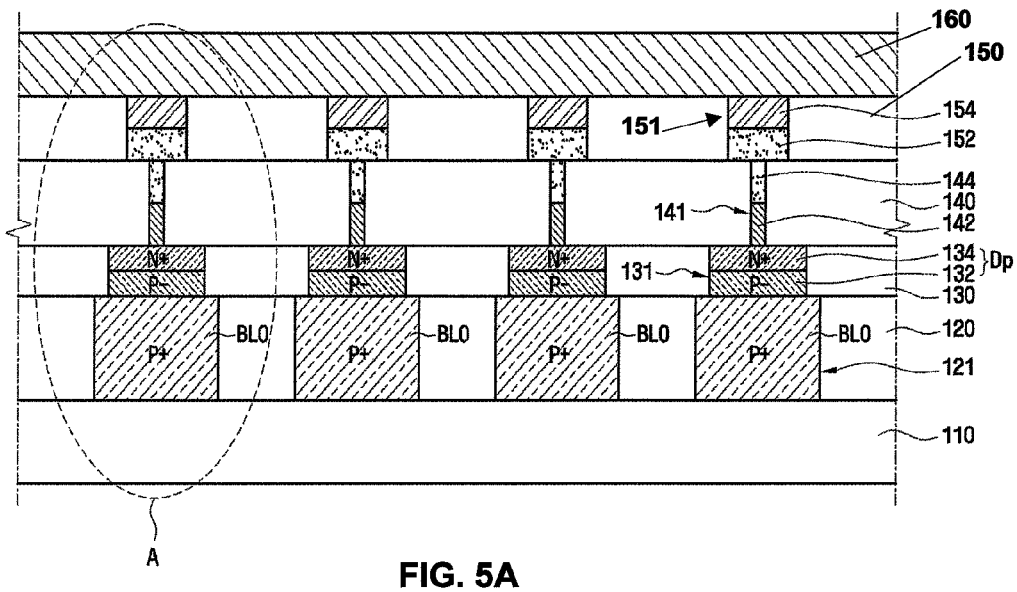
FIG. 5A is a cross-sectional view taken along line II-II' of FIG. 4.
Figure 5B:
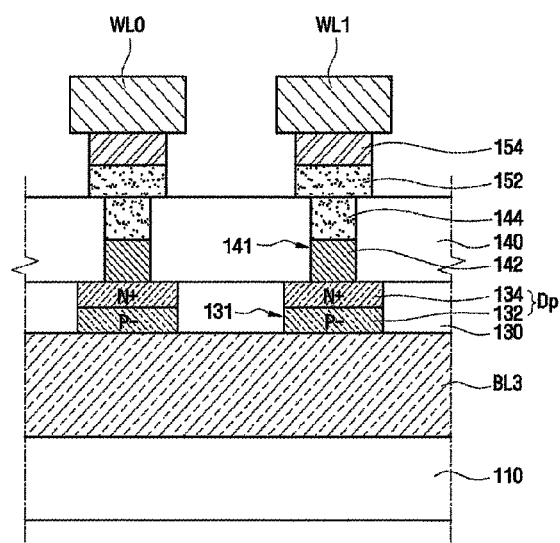
FIG. 5B is a cross-sectional view taken along line III-III' of FIG. 4.

As shown in FIGS. 5A and 5B, the memory cell array 1 includes an underlying semiconductor substrate 110. An insulating layer 120 is formed on the substrate 110, and a plurality of P+ type conductive regions 121 are contained in the insulating layer 120 to define the bit lines BL0~BL3.

An insulating layer 130 is formed over the insulating layer 130 and includes a plurality of diode elements Dp formed in apertures 131 of the insulating layer 130. As shown, the diode elements Dp contact a corresponding one of the bit lines BL0~B3 defined by the P+ type conductive regions 121. Each diode element Dp of this example includes a P-doped semiconductor layer 132 and an N+ doped semiconductor layer 131 stacked within the aperture 131 of the insulating layer 130.

An insulating layer 140 is located over the insulating layer 130, and a plurality of apertures 141 are defined within the insulating layer 140 and aligned over respective apertures 131 of the insulating layer 130. A lower electrode 142 is contained within a lower portion of each aperture 141 in electrical contact with the N+ semiconductor layer 134 of a corresponding diode element Dp. Further, a first programmable volume 144 is located in an upper portion of each aperture 141 in electrical contact with the lower electrode 142 of each aperture 141.

An insulating layer 150 is located over the insulating layer 140, and a plurality of apertures 151 are defined within the insulating layer 150 and aligned over respective apertures 141 of the insulating layer 140. A second programmable volume 152 is located within each aperture 151 of the insulating layer 150 so as to electrically contact the first programmable volume 144 within a corresponding aperture 141 of the insulating layer 140. Further, an upper electrode 154 is stacked on the second programmable volume 154 within each aperture 151 of the insulating layer 150.

Finally, each word line WL0 and WL1 in this example is formed of a metallic conductor 160 which is patterned on the insulating layer 150 so as to electrically contact rows of the upper electrodes 154.

It will be understood that the bit lines BL and word lines WL may be interchanged in the embodiment described above in connection with FIGS. 4, 5A and 5B. In other words, the bit lines BL may be substituted for word lines, and the word lines WL may be substituted for bit lines.

Presented next is a method of fabricating the memory cell A shown in FIG. 5B according to an embodiment of one or more inventive concepts described herein.

FIGS. 6~9, 10A, 10B, 11A, 11B, 12, 13A, 13B, 14A, 14B, 15A and 15B are cross-sectional and perspective views for describing a method of fabricating a phase-change memory cell device according to one or more inventive aspects described herein.

Figure 6:
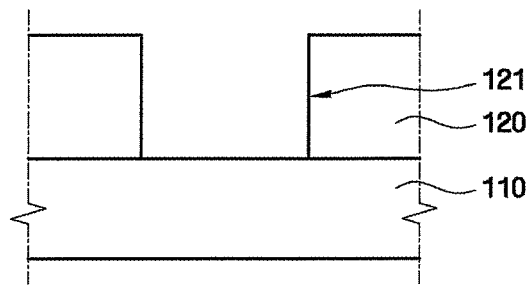

Referring to FIG. 6, reference number 110 denotes a semiconductor substrate, such as, for example, a single crystal silicon substrate or a silicon on insulator (SOI) substrate. An insulating layer 120 is deposited on the substrate 110, and an aperture 121 is formed within the insulating layer 120. The insulating layer 120 may, for example, be a silicon oxide layer, and the aperture 121 may, for example, be formed by masked etching of the insulating layer 120.

Figure 7:
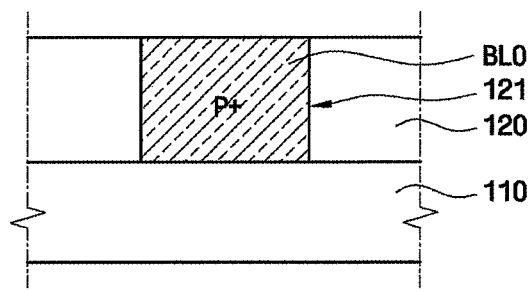

Referring to FIG. 7, the aperture 121 of the insulating layer 120 is filled with a conductive material forming a bit line BL0. In this example, the bit line BL0 is constituted of a P+ type conductive silicon which may, for example, be formed by selective epitaxial growth (SEG) on the silicon substrate 110.

Figure 8:
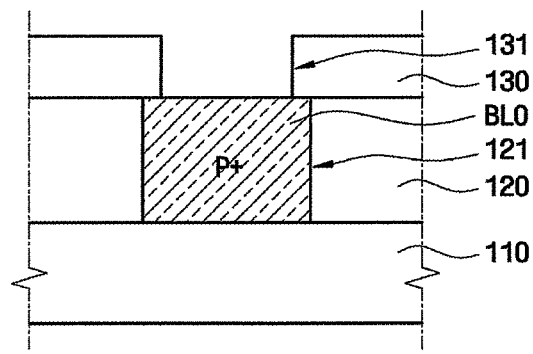

As shown in FIG. 8, an insulating layer 130 is deposited on the insulating layer 120, and an aperture 131 is formed within the insulating layer 130 so as to expose an upper surface of the bit line BL0. The insulating layer 130 may, for example, be a silicon oxide layer, and the aperture 131 may, for example, be formed by masked etching of the insulating layer 120. In this example, the aperture 131 is substantially circular in a plane parallel to an upper surface of the substrate 100, although other aperture configurations may be adopted.

Next, as shown in FIG. 9, a diode Dp is formed within the aperture 131 of the insulating layer 130. The diode Dp may be formed of a polysilicon material having different dopants types layered therein, for example, a polysilicon N+ type layer stack over a polysilicon P-type layer 132. The polysilicon material of the diode Dp may, for example, be formed by SEG of the silicon-containing bit line BL0.

Referring to FIG. 10A, an insulating layer 140 is deposited on the insulating layer 130, and an aperture 141 is formed within the insulating layer 140 so as to expose an upper surface portion of the diode Dp. The insulating layer 140 may, for example, be a silicon oxide layer, and the aperture 141 may, for example, be formed by masked etching of the insulating layer 140. The aperture 141 is then at least partially filled with a lower electrode material 142'.

Non-limiting examples of the lower electrode material 142' include titanium, hafnium, zirconium, vanadium, niobium, tantalum, tungsten, aluminum, copper, tungsten titanium, and molybdenum, a binary metal nitride, e.g., titanium nitride, hafnium nitride, zirconium nitride, vanadium nitride, niobium nitride, tantalum nitride, tungsten nitride, and molybdenum nitride; a metal oxide such as iridium oxide and ruthenium oxide, a ternary metal nitride, e.g., titanium carbon nitride, tantalum carbon nitride, titanium silicon nitride, tantalum silicon nitride, titanium aluminum nitride, tantalum aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum oxide nitride, titanium oxide nitride, and tungsten oxide nitride, silicon, or a combination of the above. In the example of this embodiment, the lower electrode material 142' is titanium nitride.

As depicted in the perspective view of FIG. 10B, the lower electrode material 142' material protrudes to a given height (within the aperture 141) above the diode Dp. Referring to FIGS. 11A and 11B, a blanket anisotropic etching process may then be carried out in order to remove a portion of the lower electrode material 142' and thus create an opening 143 within the aperture 141.

Referring to FIG. 12, a first phase-change material layer 144' is then deposited to fill the opening 143 and to cover an upper surface of the insulating layer 140. As suggested previously in connection with FIGS. 1 and 2, a non-limiting example of the first phase-change material layer 144' is SbTe. The deposition method for the phase-change material layer 144' is not limited, and examples include chemical vapor deposition (CVD), physical vapor deposition (PVD), and atomic layer deposition (ALD).

Figure 13A:
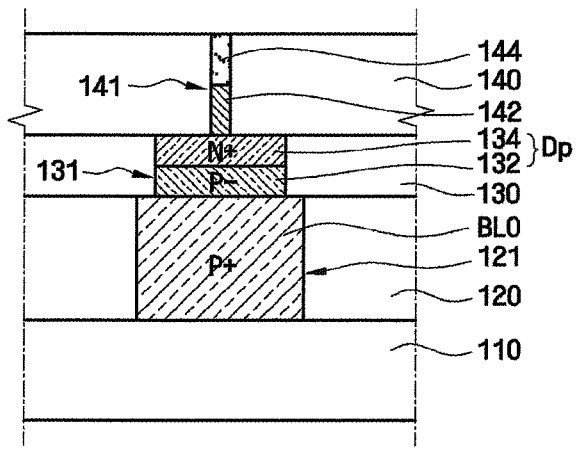
Figure 13B:
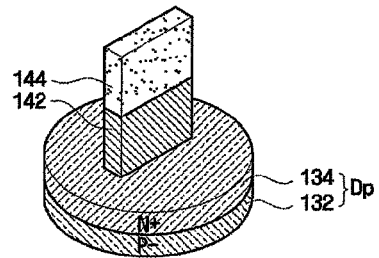

Turning now to FIGS. 13A and 13B, a first phase change material pattern is formed by planarization or blanket etching of the phase-change material layer 144' (FIG. 12). As a result, a top surface of the insulating layer 140 is exposed.

Figure 14A:
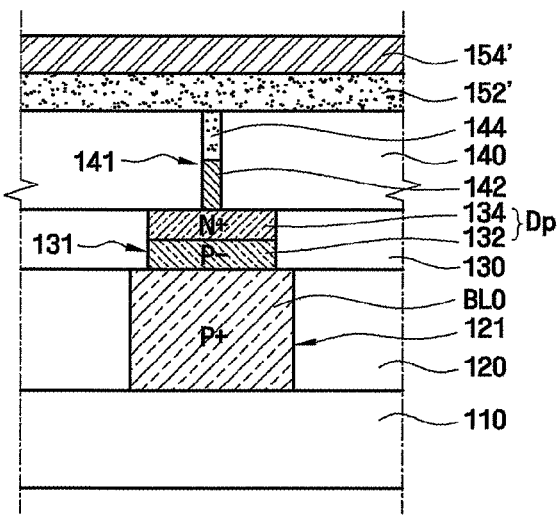
Figure 14B:
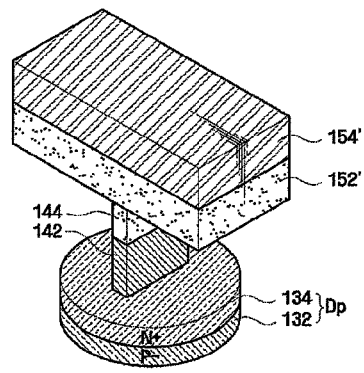

Next, as shown in FIGS. 14A and 14B, a second phase-change material layer 152' is deposited over the insulating layer 140. Again, the deposition technique is not limited, and examples in CVD, PVD and ALD.

As suggested previously in connection with FIGS. 1 and 2, the second phase-change material layer 152' is formed of a different phase-change material than that of the first phase-change material pattern 144. In particular, in this embodiment, the phase-change material layer 152' has a higher resistance in an amorphous state then the phase-change material of the first phase-change material pattern 144. Non-limiting examples of the phase-change material of the second programmable material layer 152' include GeSbTe, BeBiTe, C-doped BeSbTe and N-doped GeSbTe.

Still referencing FIGS. 14A and 14B, a conductive layer 154' is formed on the second phase-change material layer 152'. Material examples of the conductive layer 154' are the same as those listed previously in connection with the lower electrode 142. In the example of this embodiment, the conductive layer 154' includes one or more layers of Ti and/or TiN.

Referring now to FIGS. 15A and 15B, in the example of this embodiment the conductive layer 154' and the second phase-change material layer 152' are patterned using a common mask to form the phase change material pattern 152 and the top electrode 154.

As one skilled in the art will appreciate, the fabrication method described above may be subjected to a number of different variations. For example, FIG. 16 illustrates a technique in which the second phase-change material pattern 152 is formed by filling an aperture in an upper insulating layer 150, and thereafter the upper electrode 154 is formed by deposition and patterning over the second phase-change material pattern 152. In this case, the phase-change material pattern 152 may, for example, be formed by deposition followed by planarization and/or blanket etching.

In addition to variations in fabrication, one skilled in the art will also appreciate that structural variations are available as well. Non-limiting examples of such variations in structure are described next with reference to FIGS. 17~20.

Figure 17:
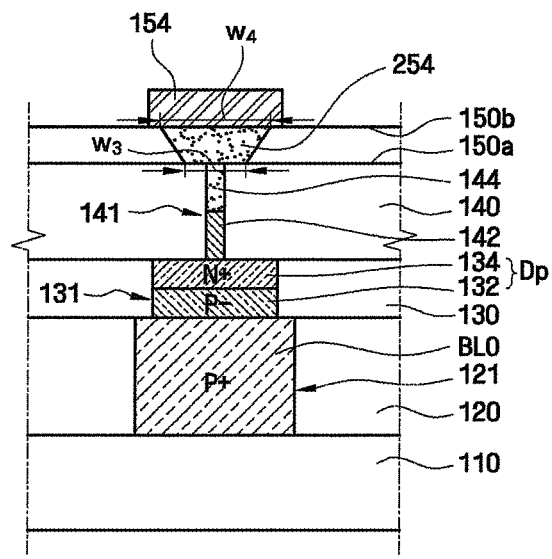
FIG. 17 is a perspective view of another phase-change memory cell according to an embodiment of one or more inventive aspects described herein.

FIG. 17 illustrates an embodiment in which the aperture in the upper insulating layer 150 is narrower at the opening in the lower surface 150a thereof than at the upper surface 150b thereof. As a result, the second phase-change material pattern 254 exhibits a tapered or trapezoidal profile in which a lower width W3 is less than upper width W4. This embodiment may be effective in increasing a difference in cell resistance between the D10 and D11 states described previously in connection with FIGS. 3A~3D.

Figure 18:
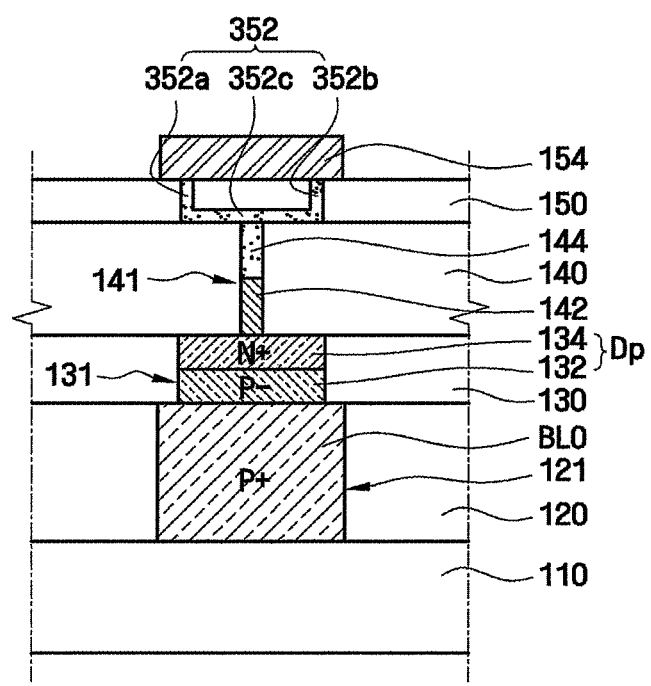
FIG. 18 is a perspective view of another phase-change memory cell according to an embodiment of one or more inventive aspects described herein.
Figure 19:
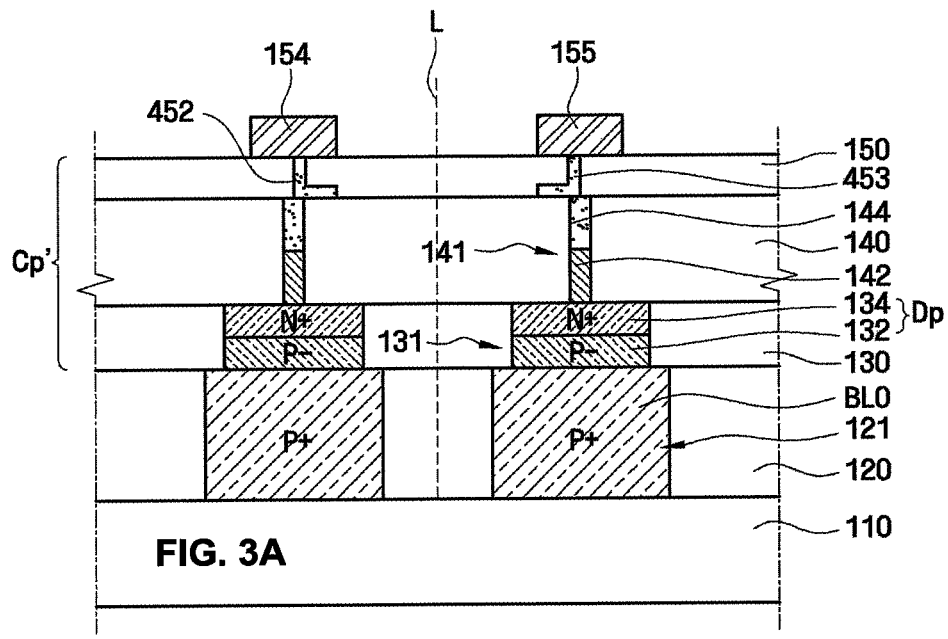
FIG. 19 is a perspective view of another phase-change memory cell according to an embodiment of one or more inventive aspects described herein.

FIGS. 18 and 19 illustrate examples in which the basic shape of the second phase-change material pattern is altered.

That is, in the example of FIG. 18, the second phase-change material pattern 352 has a U-shaped configuration which includes a bottom wall 352c, and opposite sidewalls 352a and 352b extending upwardly from the bottom wall 352c.

In the example of FIG. 19, reference numbers 452 and 453 denote first and second upper phase-change material patterns and reference numbers 154 and 155 denote corresponding upper electrodes. This figure is representative of three variations from the previous embodiments, each independent of the other. First, the upper phase-change material patterns 452 and 453 are not centrally aligned over the corresponding lower first phase-change material patterns 144. Second, the shape of the second phase-change material patterns 452 and 453 is not symmetrical about an axis normal to the surface of the substrate 110. Third, the first upper phase-change material pattern 452 is effectively configured as a mirror image of the second upper phase-change material pattern 453.

Figure 20:
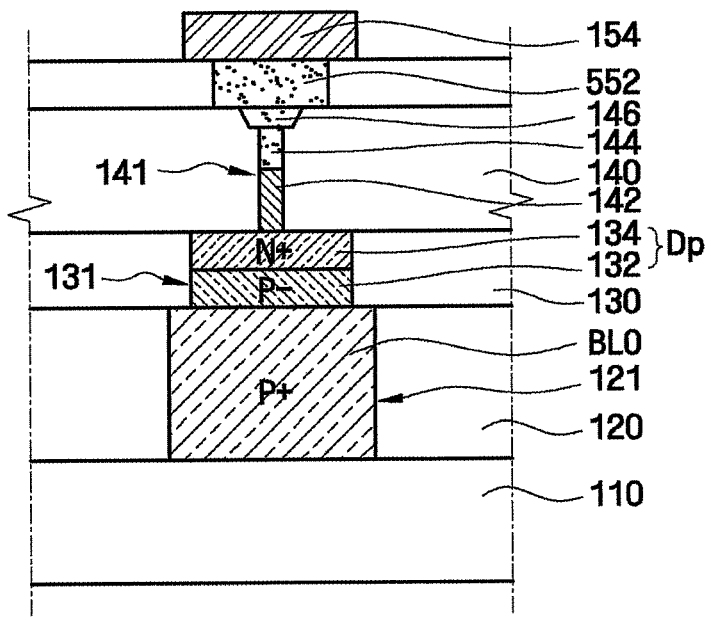
FIG. 20 is a perspective view of another phase-change memory cell according to an embodiment of one or more inventive aspects described herein.

FIG. 20 illustrates yet another variation in which one of the phase-change material patterns includes two sections of phase-change material. Namely, a first phase-change material pattern includes a first phase-change material section 144 stacked over the lower electrode 142, and a second phase-change material second 146 stacked over the first phase-change material section 144. Further, a second phase-change material pattern 552 is stacked over the second phase change material section 146. Also, in this example, a width of the second phase change material section 146 is greater than that of the first phase-change material section 144, and a width of the second phase-change material pattern 552 is greater than that of the second phase-change material section 146. Further, in this example, a resistance in an amorphous state of the second phase-change material section 146 is greater than a resistance in an amorphous state of the first phase-change material section 144, and a resistance in an amorphous state of the second phase-change material pattern 552 is greater than a resistance in an amorphous state of the second phase-change material section 146.

Programming of the phase-change memory cell illustrated in FIG. 1 will now be described with reference to FIGS. 21~28.

Figure 21:
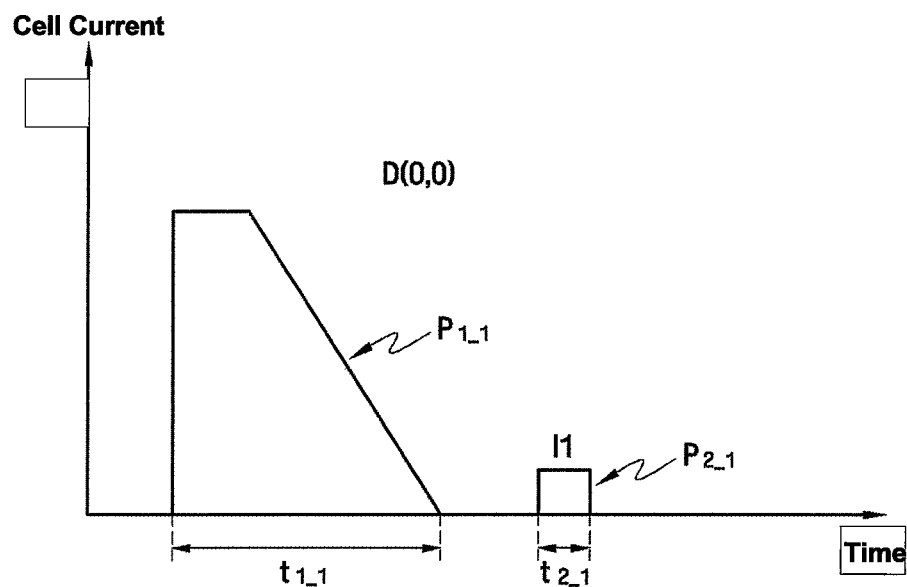
FIG. 21 is a graph illustrating an example of a programming current utilized to program a phase-change memory cell into a first data state according to one or more inventive aspect described herein.
Figure 22:
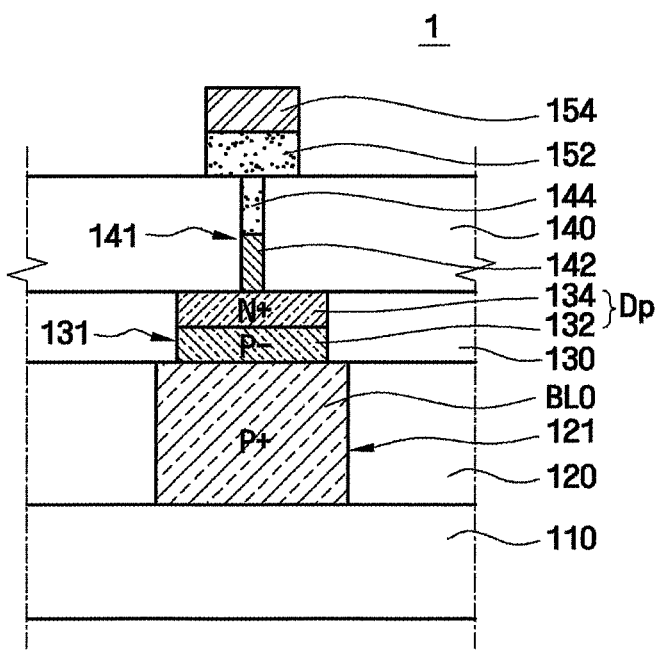
FIG. 22 is a cross-sectional view of a phase-change memory cell after programming in the first data state.

FIG. 22 is representative of the memory cell in a data state "00", namely, a lowest resistance state in which both the first phase-change material pattern 144 and the second phase-change material pattern 152 are crystalline. Referring to FIG. 21, the data state "00" may be realized by applying an erase current pulse P1_1 during a time interval t1_1, followed by a write current pulse P2_1 during a time interval t2_1. As shown, the duration of the pulse interval t2_1 may be less than that of the pulse interval t1_1. Further, the magnitude I1 of the write current pulse P2_1 is relatively small as compared to that of the erase current pulse P1_1. In fact, the erase current pulse P1_1 may by itself be sufficient to achieve a crystallized state of the first and second phase-change material patterns 144 and 152. As such, the write current pulse P2_1 may be omitted.

Figure 23:
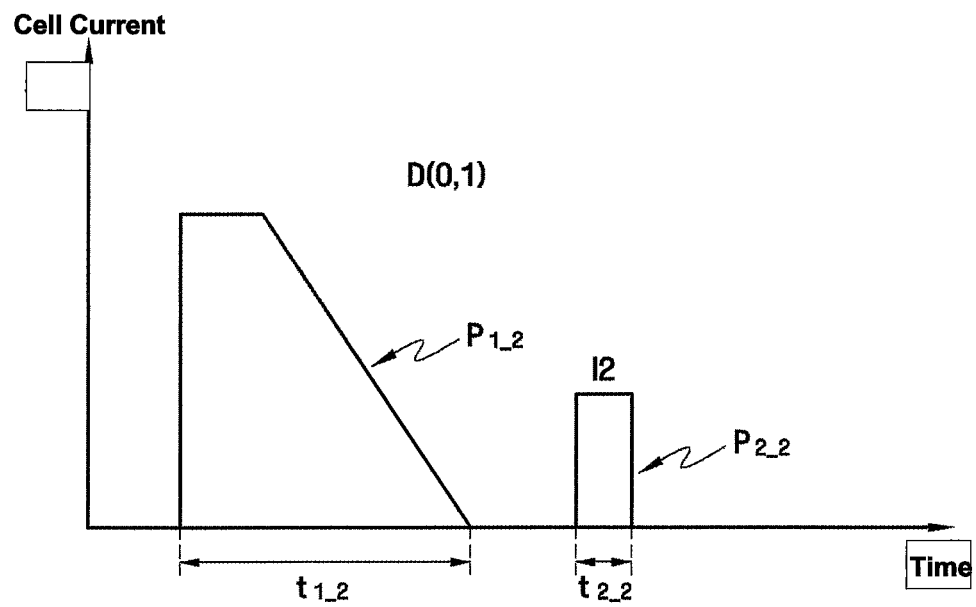
FIG. 23 is a graph illustrating an example of a programming current utilized to program a phase-change memory cell into a second data state according to one or more inventive aspect described herein.
Figure 24:
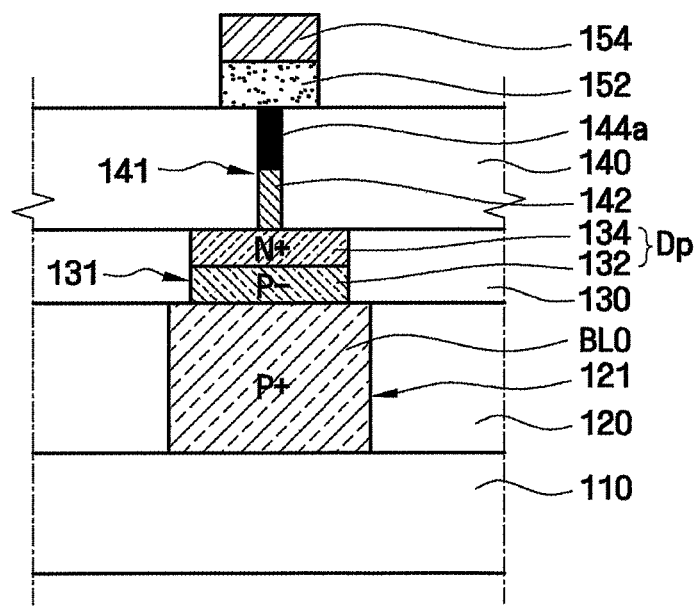
FIG. 24 is a cross-sectional view of a phase-change memory cell after programming in the second data state.

FIG. 24 is representative of the memory cell in a data state "01", namely, a resistance state in which the first phase-change material pattern 144 is amorphous (144a) and the second phase-change material pattern 152 is crystalline. Referring to FIG. 23, the data state "01" may be realized by applying an erase current pulse P1_2 during a time interval t1_2, followed by a write current pulse P2_2 during a time interval t2_2. Again, the duration of the pulse interval t2_2 may be less than that of the pulse interval t1_2. Further, the magnitude I2 of the write current pulse P2_2 is larger than that (if any) of the write current pulse P2_1 illustrated in FIG. 21.

Figure 25:
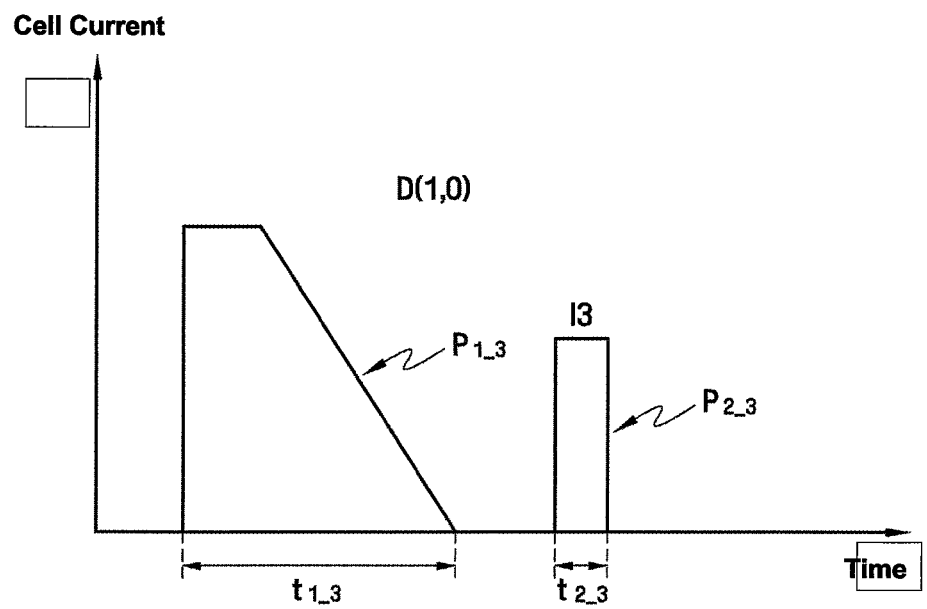
FIG. 25 is a graph illustrating an example of a programming current utilized to program a phase-change memory cell into a third data state according to one or more inventive aspect described herein.
Figure 26:
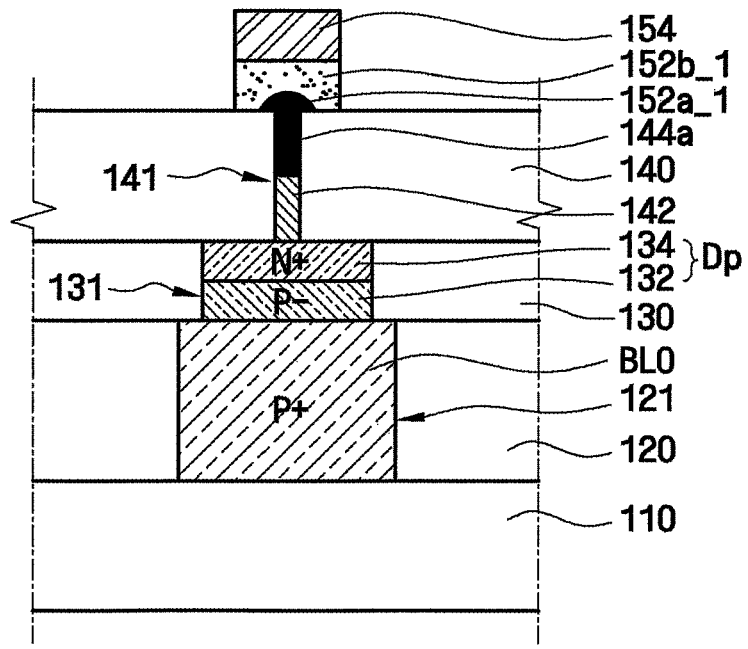
FIG. 26 is a cross-sectional view of a phase-change memory cell after programming in the third data state.

FIG. 26 is representative of the memory cell in a data state "10", namely, a resistance state in which the first phase-change material pattern 144 is amorphous (144a), a first portion 152a_1 of second phase-change material pattern 152 is amorphous, and a remaining portion 152b_1 of the second phase-change material pattern 152 is crystalline. Referring to FIG. 25, the data state "10" may be realized by applying an erase current pulse P1_3 during a time interval t1_3, followed by a write current pulse P2_3 during a time interval t2_3. Again, the duration of the pulse interval t2_3 may be less than that of the pulse interval t1_3. Further, the magnitude I3 of the write current pulse P2_3 is larger than that (I2) of the write current pulse P2_2 illustrated in FIG. 23.

Figure 27:
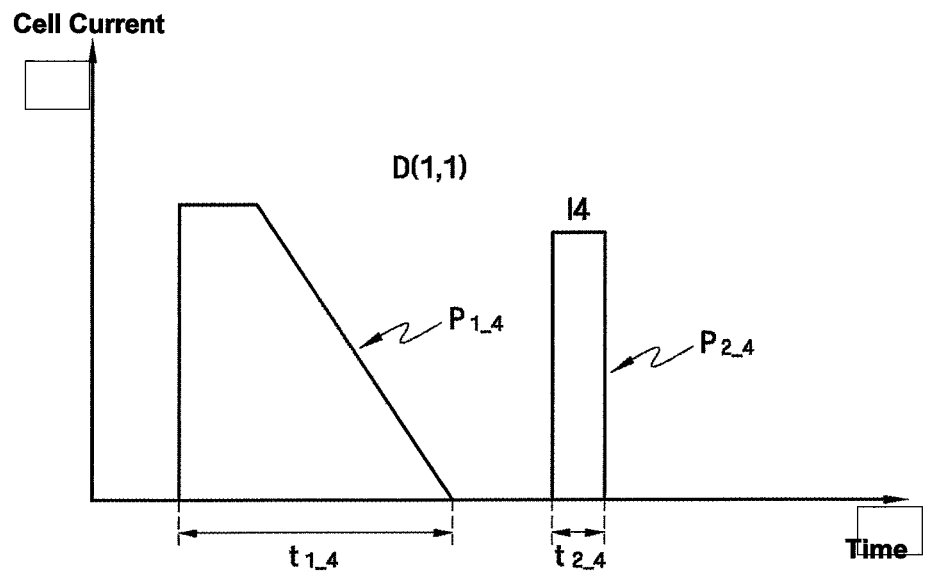
FIG. 27 is a graph illustrating an example of a programming current utilized to program a phase-change memory cell into a fourth data state according to one or more inventive aspect described herein.
Figure 28:
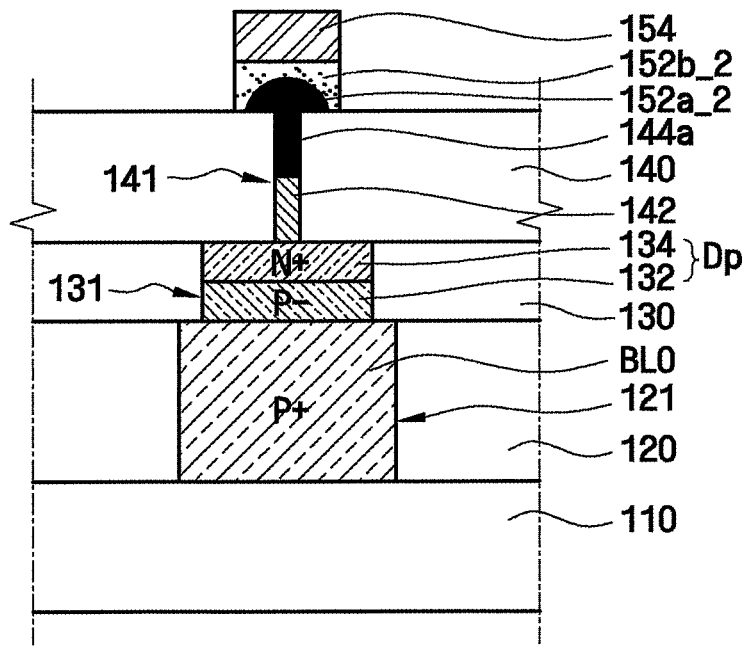
FIG. 28 is a cross-sectional view of a phase-change memory cell after programming in the fourth data state.

FIG. 28 is representative of the memory cell in a data state "11", namely, a highest resistance state in which the first phase-change material pattern 144 is amorphous (144a), a larger second portion 152a_2 of second phase-change material pattern 152 is amorphous, and a remaining portion 152b_2 of the second phase-change material pattern 152 is crystalline. Referring to FIG. 27, the data state "11" may be realized by applying an erase current pulse P1_4 during a time interval t1_4, followed by a write current pulse P2_4 during a time interval t2_4. As before, the duration of the pulse interval t2_34 may be less than that of the pulse interval t1_4. Further, the magnitude I4 of the write current pulse P2_4 is larger than that (I3) of the write current pulse P2_3 illustrated in FIG. 25.

As described above, the phase-change memory cell includes a first phase-change material pattern having a lower amorphous resistance that a second phase-change material pattern. Further, one or more of the inventive concepts described herein is at partially characterized by a contiguously increasing size in the volume of amorphous material as the memory cell is programmed in succession from data "01"

to "10" to "11". Further, one or more inventive concepts described herein are partially characterized by confining the volume of the first phase-change material pattern relative to that of the second phase change material pattern, to thereby enhance control of the multi-bit data programming. The phase-change memory cell is thus functional in any number of devices utilizing electronic memory, particularly non-volatile multi-bit memory.

As mentioned previously, the phase-change memory cell is considered an example of a broader class of devices often referred to as resistance variable memory devices. The inventive concepts described herein are thus not limited to phase-change memory devices, and may also be applied to other resistance variable memory devices.

Various examples of real-world application of the resistance variable memory cells described above are presented next. These applications are collectively referred to herein as memory systems.

Figure 29:
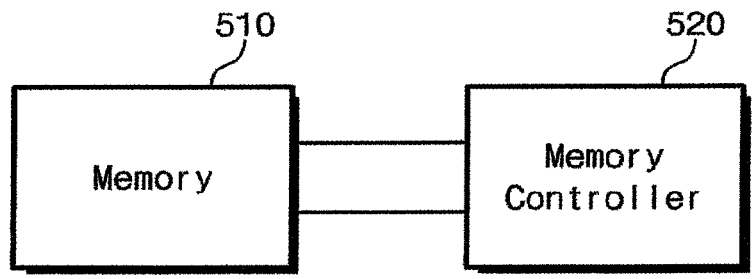
FIG. 29~36 are block diagrams illustrating a memory system and devices incorporating phase-change memory cells according to one or more inventive aspects described herein.

FIG. 29 illustrates an apparatus including a resistance variable memory device adopting one or more inventive concepts described herein. As shown, the apparatus includes a memory 510 and a memory controller 520. The memory 510 may include a resistance variable memory device as described herein. The memory controller 520 may supply an input signal to control an operation of the memory 510. For example, the memory controller 520 may supply a command language and an address signal. The memory controller 520 may control the memory 510 based on a received control signal.

Figure 30:
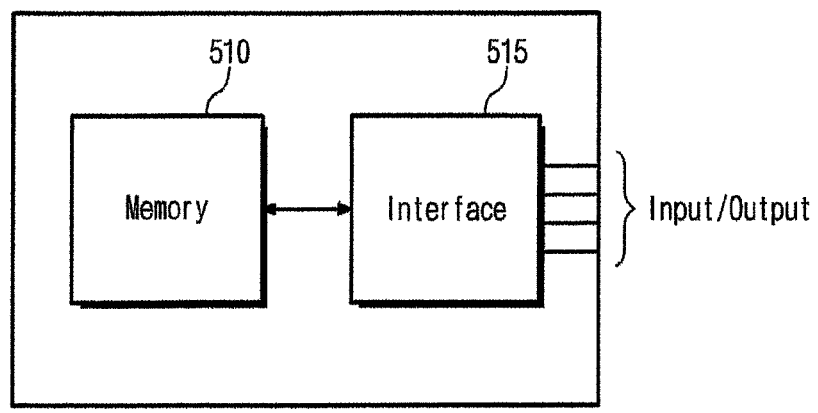

FIG. 30 illustrates an apparatus including a resistance variable memory device adopting one or more inventive concepts described herein. As shown, the apparatus includes a memory 510 connected to an interface 515. The memory 510 may include a resistance variable memory device as described herein. The interface 515 may provide, for example, an external input signal. For example, the interface 515 may provide a command language and an address signal. The interface 515 may control the memory 510 based on a control signal which is generated from an outside and received.

Figure 31:
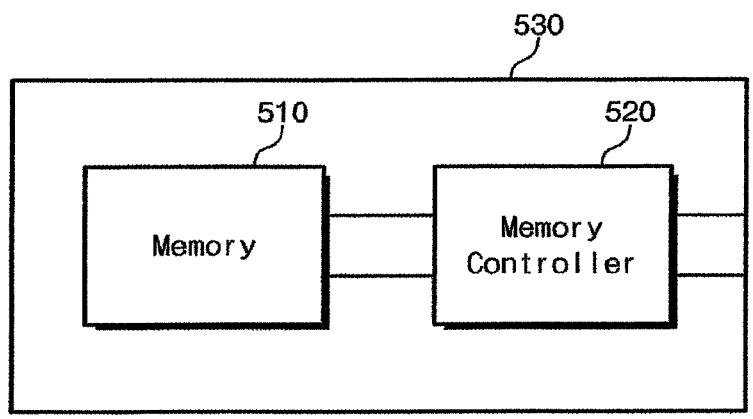

FIG. 31 illustrates an apparatus including a resistance variable memory device adopting one or more inventive concepts described herein. As shown, the apparatus is similar to the apparatus of FIG. 29, except that the memory 510 and the memory controller 520 are embodied by a memory card 530. For example, the memory card 530 may be a memory card satisfying a standard for compatibility with electronic appliances, e.g., digital cameras, personal computers or the like. The memory controller 520 may control the memory 510 based on a control signal which the memory card receives from a different device, for example, an external device.

Figure 32:
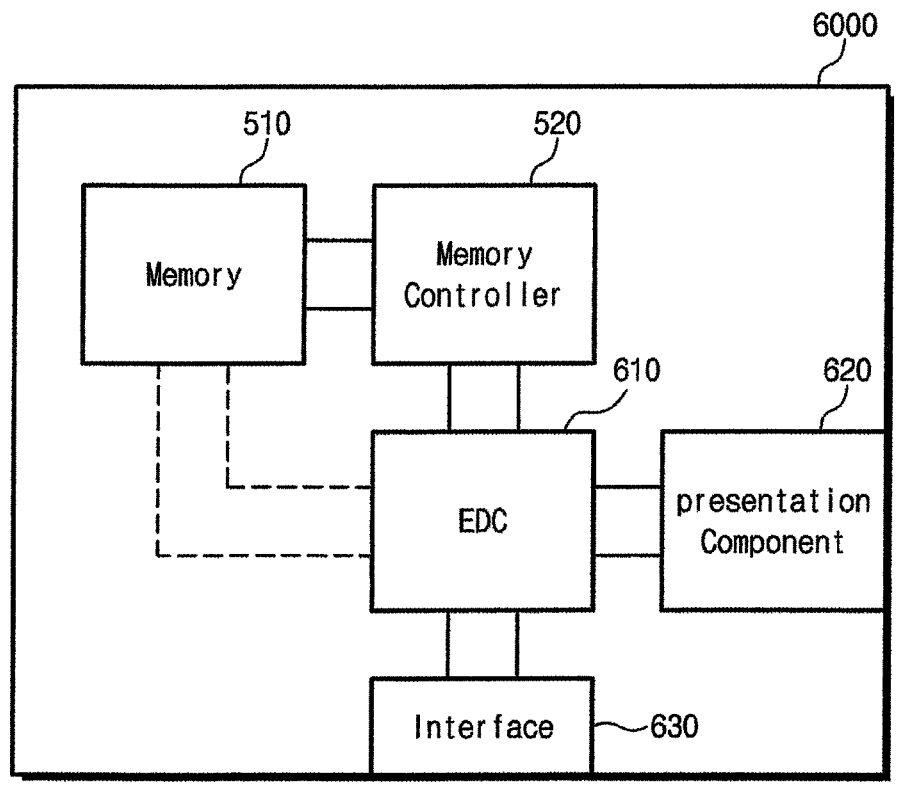

FIG. 32 illustrates a mobile device 6000 including a resistance variable memory device adopting one or more inventive concepts described herein. The mobile device 6000 may be an MP3, a video player, a video, audio player or the like. As illustrated in the drawing, the mobile device 6000 includes the memory 510 and the memory controller 520. The memory 510 may include a resistance variable memory device as described herein. The mobile device 6000 may include an encoder and decoder EDC 610, a presentation component 620, and an interface 630. Data such as videos and audios may be exchanged between the memory 510 and the encoder and decoder EDC 610 via the memory controller 520. As indicated by a dotted line, data may be directly exchanged between the memory 510 and the encoder and decoder EDC 610. EDC 610 may encode data to be stored in the memory 510. For example, EDC 610 may encode audio data into an MP3 file and store the encoded MP3 file in the memory 510. Alternatively, EDC 610 may encode MPEG video data (e.g., MPEG3, MPEG4, etc.) and store the encoded video data in the memory 510. Also, EDC 610 may include a plurality of encoders that encode different data type according to different data formats. For example, EDC 610 may include an MP3 encoder for audio data and an MPEG encoder for video data. EDC 610 may decode output data from the memory 510. For example, EDC 610 may decode audio data output from the memory 510 into an MP3 file. Alternatively, EDC 610 may decode video data output from the memory 510 into an MPEG file. Also, EDC 610 may include a plurality of decoders that decode a different type of data according to a different data format. For example, EDC 610 may include an MP3 decoder for audio data and an MPEG decoder for video data. Also, EDC 610 may include only a decoder. For example, previously encoded data may be delivered to EDC 610, decoded, and then delivered to the memory controller 520 and/or the memory 510. EDC 610 may receive data to encode or previously encoded data via the interface 630. The interface 630 may comply with a well-known standard, e.g., USB, firewire, etc. The interface 630 may include one or more interfaces, e.g., a firewire interface, a USB interface, etc. The data provided from the memory 510 may be output via the interface 630. The presentation component 620 may represent data decoded by the memory 510 and/or EDC 610 such that a user can perceive the decoded data. For example, the presentation component 620 may include a display screen displaying a video data, etc., and a speaker jack to output an audio data.

Figure 33:
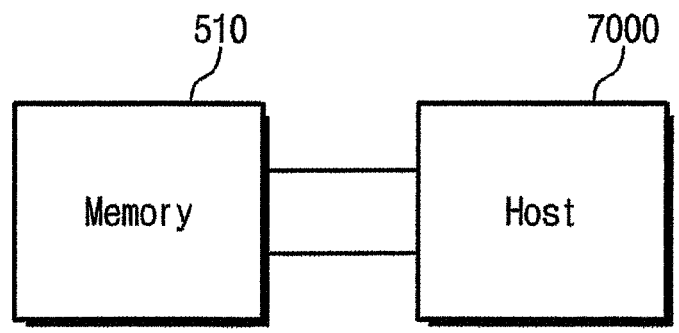

FIG. 33 illustrates an apparatus including a resistance variable memory device adopting one or more inventive concepts described herein. As shown, the memory 510 may be connected to a host system 7000. The memory 510 includes a resistance variable memory as described herein. The host system 7000 may be a processing system, e.g., a personal computer, a digital camera, etc. The memory 510 may be a detachable storage medium, e.g., a memory card, a USB memory, or a solid-state driver SSD. The host system 7000 may provide an input signal, e.g., a command language and an address signal, controlling an operation of the memory 510.

Figure 34:
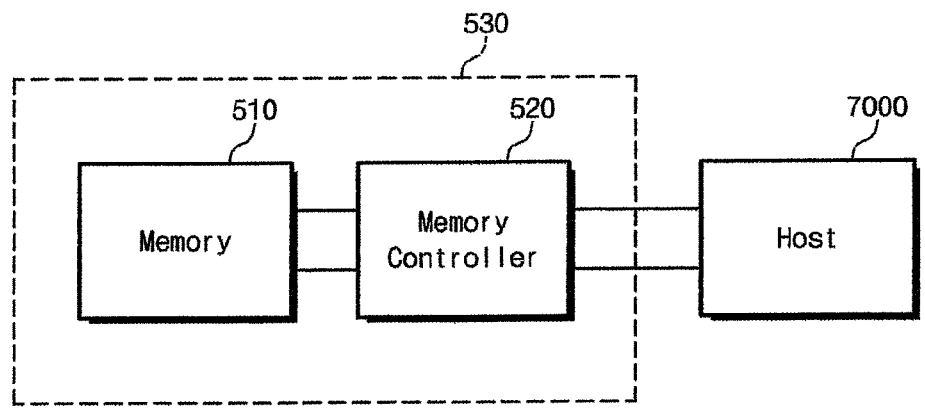

FIG. 34 illustrates an apparatus including a resistance variable memory device adopting one or more inventive concepts described herein. In this example, the host system 7000 may be connected to the memory card 530. The host system 7000 may supply a control signal to the memory card 530, enabling the memory controller 520 to control operation of the memory 510.

Figure 35:
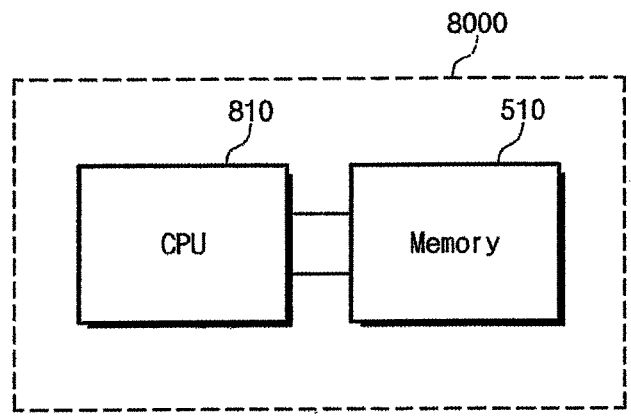

FIG. 35 illustrates an apparatus including a resistance variable memory device adopting one or more inventive concepts described herein. As illustrated, the memory 510 may be connected with a central processing unit CPU 810 of a computer system 8000. For example, the computer system 8000 may be a personal computer, a personal data assistant, etc. The memory 510 may be connected to the CPU 810 via a bus.

Figure 36:
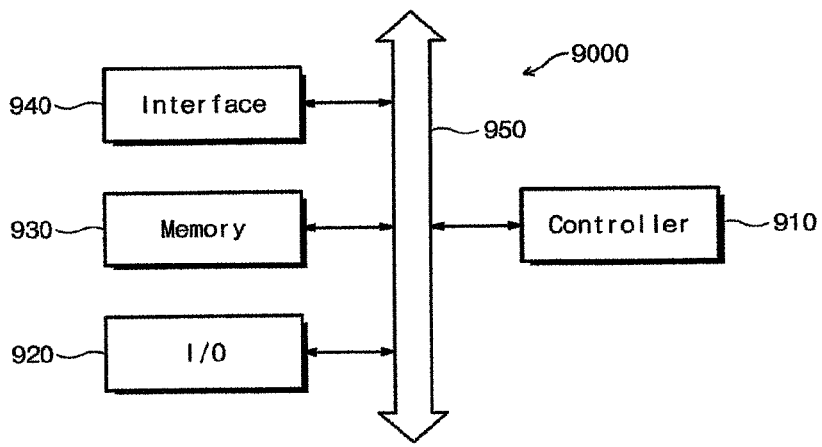

FIG. 36 illustrates an apparatus including a resistance variable memory device adopting one or more inventive concepts described herein. As shown in FIG. 36, the apparatus 9000 may include a controller 910, an input/output unit 920, e.g., a keyboard, a display or the like, a memory 930, and an interface 940. The respective components constituting the apparatus may be connected to each other via a bus 950. The controller 910 may include at least one microprocessor, digital processor, microcontroller, or processor. The memory 930 may store a command executed by data and/or the controller 910. The interface 940 may be used to transmit data from a different system, for example, a communication network, or to a communication network. The apparatus 9000 may be a mobile system, e.g., a PDA, a portable computer, a web tablet, a wireless phone, a mobile phone, a digital music player, a memory card or a different system that can transmit and/or receive information.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A multi-bit memory cell programmable into at least four data states, comprising:
    a first resistance variable material pattern comprising first resistance variable material that is programmable between first and second resistive states;
    a second resistance variable material pattern juxtaposed in a vertical direction with the first resistance variable material pattern, the second resistance variable material pattern consisting of one second resistance variable material that is programmable between the first and second resistive states, wherein the second resistance variable material is different than the first resistance variable material, and wherein a resistance of the first resistance variable material in the second resistive state is less than a resistance of the second variable resistance material in the second resistive state, and
    wherein the second resistance variable material pattern has a constant width, in a direction perpendicular to the vertical direction, and a width of the first variable resistance material pattern in said direction perpendicular to the vertical direction is different than the width of the second variable resistance material pattern, and
    the cell is selectively programmable to a first data state in which both the first resistance variable material and the second resistance variable material are in the first resistive state,
    a second data state in which at least a portion of the first resistance variable material is in the second resistive state and all of the second resistance variable material is in the first resistive state,
    a third data state in which the first resistance variable material is in the second resistive state, and a first portion of the second resistance variable material is in the second resistive state while a remaining portion of the second resistance variable material is in the first resistive state, the first portion of the second resistance variable material being contiguous with the first resistance variable material, and
    a fourth data state in which the first resistance variable material is in the second resistive state and a second portion of the second resistance variable material is in the second resistive state while a remaining portion of the second resistance variable material is in the first resistive state, the second portion of the second variable resistance material having a larger volume than that of the first portion of the second resistance variable material in the third data state and being contiguous with the first resistance variable material.

2. The multi-bit resistance variable memory cell of claim 1, wherein the width of the first variable resistance material pattern is less than the width of the second variable resistance material pattern.

3. The multi-bit resistance variable memory cell of claim 1, wherein a resistance of each of the variable resistance materials in the first resistive state is less than a resistance of the second resistive state.

4. The multi-bit resistance variable memory cell of claim 1, wherein the elements composing the first and second resistance variable materials are respectively different.

5. The multi-bit resistance variable memory cell of claim 4, wherein the first resistance variable material comprises SbTe, and the second resistance variable material is selected from the group consisting of GeSbTe, BeBiTe, C-doped GeSbTe and GeSbTe.

6. The multi-bit resistance variable memory cell of claim 1, wherein the first resistive state is a crystalline state and the second resistive state is an amorphous state.

7. The multi-bit resistance variable memory cell of claim 6, wherein the entire first resistance variable material pattern is amorphous in the second, third and fourth data states.

8. The multi-bit resistance variable memory cell of claim 4, wherein the width of the first resistance variable material pattern is less than half the width of the second resistance variable material pattern.

9. The multi-bit resistance variable memory cell of claim 4, wherein the first through fourth data states denote multi-bit data 00, 01, 10 and 11, respectively.

10. The multi-bit resistance variable memory cell of claim 4, further comprising:
    an upper electrode connected to the second resistance variable material pattern;
    a lower electrode connected to the first resistance variable material pattern; and
    a selection element connected to one of the upper and lower electrodes.

11. The multi-bit resistance variable memory cell of claim 10, wherein the selection element is a diode.

12. The multi-bit resistance variable memory cell of claim 11, further comprising a word line or a bit line formed of doped polysilicon connected to the diode.

13. The multi-bit resistance variable memory cell of claim 1, wherein the first resistance variable material pattern has a constant width, in the direction perpendicular to the vertical direction, and consists of the first variable resistance material.

14. A device including a multi-bit memory cell, the device comprising:
    a substrate; and
    a programmable phase change element disposed on the substrate and whose profile perpendicular to the substrate has only one step,
    the phase change element consisting of a volume of one first phase change material and a volume of one second phase change material juxtaposed with the volume of the first change material in a direction perpendicular to the substrate as contiguous therewith,
    the first phase change material being different than the second phase change material and such that the resistance of the first phase change material in a first one of its resistive states is different than the resistance of the second phase change material in the same first one of its resistive states, and
    wherein the step in the profile of the phase change member exists between the volumes of the first and second phase change materials such that a width of the volume of the first phase change material and a width of the volume of the second phase change material in a direction parallel to the substrate are different from one another, and
    the phase change element is selectively programmable to at least four different data states including:

a first data state in which both the first phase change material and the second phase change material are in the same first resistive state, a second data state in which at least a portion of the first resistance variable material is in a second resistive state different from the first resistive state and the second phase change material is in the first resistive state, a third data state in which the first phase change material is in the second resistive state, and a first portion of the second phase change material is in the second resistive state while a remaining portion of the second phase change material is in the first resistive state, the first portion of the second resistance phase change being contiguous with the first phase change material, and a fourth data state in which the first phase change material is in the second resistive state and a second portion of the second phase change material is in the second resistive state while a remaining portion of the second resistance variable material is in the first resistive state, the second portion of the second phase change material of the second resistance variable material in the third data state having a larger volume than that of the first portion and being contiguous with the first phase change material.

15. The semiconductor device of claim 14, wherein the phase change element consists of a first pattern of the first phase change material, and a second pattern of the second phase change material, each of the patterns having a constant width in a direction parallel to the substrate.

16. The semiconductor device of claim 14, wherein the phase change element consists of a first pattern of the first phase change material, and a second pattern of the second phase change material, the first pattern having a constant width in a direction parallel to the substrate, and the second pattern having a width in said direction parallel to the substrate that increases in a direction away from the first pattern.

17. The semiconductor device of claim 14, wherein the phase change element consists of a first pattern of the first phase change material, and a second pattern of the second phase change material, the first pattern having a constant width in a direction parallel to the substrate, and the second pattern having a U-shaped cross section.

18. The device of claim 14, wherein the first phase change material is SbTe, and the second phase change material is selected from the group consisting of GeSbTe, BeBiTe, C-doped GeSbTe and GeSbTe.

19. The device of claim 14, further comprising an upper electrode, a lower electrode, and a selection element disposed on the substrate and wherein the phase change element is interposed between and electrically connected to the upper and lower electrodes, and one of the electrodes is interposed between and electrically connected to the selection element and the phase change element.

20. The semiconductor device of claim 19, wherein the selection element is a diode.

* * * * *